(12) United States Patent
Nozawa (10) Patent No.: US 11,375,606 B2
(45) Date of Patent: Jun. 28, 2022

(54) ELECTRONIC APPARATUS (71) Applicant: Sony Interactive Entertainment Inc., Tokyo (JP)

(72) Inventor: Tetsufumi Nozawa, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 0 days.

(21) Appl. No.: 17/196,043

(22) Filed: Mar. 9, 2021

(65) Prior Publication Data

US 2021/0298167 A1 Sep. 23, 2021

(30) Foreign Application Priority Data

Mar. 19, 2020 (JP) .............................. JP2020-049721

(51) Int. Cl.
*H05K 1/02* (2006.01)

(52) U.S. Cl.
CPC ......... *H05K 1/0225* (2013.01); *H05K 1/0298* (2013.01); *H05K 2201/10189* (2013.01)

(58) Field of Classification Search
CPC .............. H05K 1/0225; H05K 1/0298; H05K 2201/10189; H05K 9/006; H05K 9/0039; H05K 2201/10371; H05K 1/0218; H05K 9/0022; H05K 9/0024; H05K 9/0026; H05K 1/0216; H05K 9/0037; H05K 1/0224; H05K 9/0033; H05K 2201/0715; H05K 2201/10409; H01R 12/724
See application file for complete search history.

(56) References Cited

U.S. PATENT DOCUMENTS

| | | | |
|---|---|---|---|
| 5,107,404 A * | 4/1992 | Tam | H04B 1/38 361/736 |
| 5,168,344 A | 12/1992 | Ehlert | |
| 5,414,597 A * | 5/1995 | Lindland | H05K 9/0037 174/361 |

(Continued)

FOREIGN PATENT DOCUMENTS

| | | |
|---|---|---|
| JP | 09283962 A | 10/1997 |
| JP | 10294588 A | 11/1998 |

(Continued)

OTHER PUBLICATIONS

Office Action for corresponding JP Application No. 2020-049721, 16 pages, dated Apr. 6, 2022.

*Primary Examiner* — Steven T Sawyer
(74) *Attorney, Agent, or Firm* — Matthew B. Dernier, Esq.

(57) ABSTRACT

Disclosed is an electronic apparatus including a printed board, a plurality of connectors mounted on the printed board, a plurality of communication control circuits that is mounted on the printed board and that controls communication through corresponding ones of the plurality of connectors, and a shield member disposed to face the printed board, in which an annular ground pattern surrounding, without interruption, a shield area including the plurality of communication control circuits is formed on a front surface of the printed board, the plurality of connectors is all disposed outside the ground pattern surrounding the shield area, and the shield member covers the shield area and is fixed to the printed board such that a portion facing the ground pattern is electrically connected to the ground pattern.

4 Claims, 9 Drawing Sheets

(56) References Cited

U.S. PATENT DOCUMENTS

| | | | | |
|---|---|---|---|---|
| 5,504,659 A | * | 4/1996 | Acatay | H05K 9/0037 |
| | | | | 361/816 |
| 5,566,040 A | * | 10/1996 | Cosquer | H05K 9/0037 |
| | | | | 361/107 |
| 5,684,340 A | * | 11/1997 | Soler | H05K 9/0039 |
| | | | | 307/91 |
| 6,219,258 B1 | * | 4/2001 | Denzene | H01R 13/5219 |
| | | | | 174/358 |
| 7,293,998 B2 | * | 11/2007 | Nagashima | H05K 9/0018 |
| | | | | 361/752 |
| 2004/0264149 A1 | | 12/2004 | Carswell | |
| 2007/0279876 A1 | | 12/2007 | Weiblen | |
| 2019/0364703 A1 | | 11/2019 | Nozawa | |

FOREIGN PATENT DOCUMENTS

| | | |
|---|---|---|
| JP | 2001007589 A | 1/2001 |
| JP | 2002141811 A | 5/2002 |
| JP | 2005129866 A | 5/2005 |

* cited by examiner

ELECTRONIC APPARATUS

CROSS REFERENCE TO RELATED APPLICATIONS

This application claims the benefit of Japanese Priority Patent Application JP 2020-049721 filed Mar. 19, 2020, the entire contents of which are incorporated herein by reference.

BACKGROUND

The present disclosure relates to an electronic apparatus including a plurality of connectors.

In general, an electronic apparatus incorporates a printed board on which a plurality of circuit elements is mounted. The circuit elements include those which generate an electromagnetic field serving as noise affecting operations of other circuit elements or wireless communication or the like. For preventing propagation of such noise, it is practiced to cover the circuit element serving as a noise generation source by a shield member formed from a metal plate or the like.

SUMMARY

Even when the shield member is disposed so as to cover the circuit element serving as a noise generation source, if a signal line connecting the circuit element inside the shield member and an external connector is present on a front surface of the printed board, it is difficult to perfectly cover the circuit element with the shield member.

Thus, the present disclosure has been devised in light of the foregoing, and it is desirable to provide an electronic apparatus effectively capable of restraining propagation of noise generated by a circuit element on a printed board.

According to an embodiment of the present disclosure, there is provided an electronic apparatus including a printed board, a plurality of connectors mounted on the printed board, a plurality of communication control circuits that is mounted on the printed board and that controls communication through corresponding ones of the plurality of connectors, and a shield member disposed to face the printed board, in which an annular ground pattern surrounding, without interruption, a shield area including the plurality of communication control circuits is formed on a front surface of the printed board, the plurality of connectors is all disposed outside the ground pattern surrounding the shield area, and the shield member covers the shield area and is fixed to the printed board such that a portion facing the ground pattern is electrically connected to the ground pattern.

DETAILED DESCRIPTION OF THE PREFERRED EMBODIMENT

An embodiment of the present disclosure will be described in detail below, on the basis of the drawings.

Figure 1:
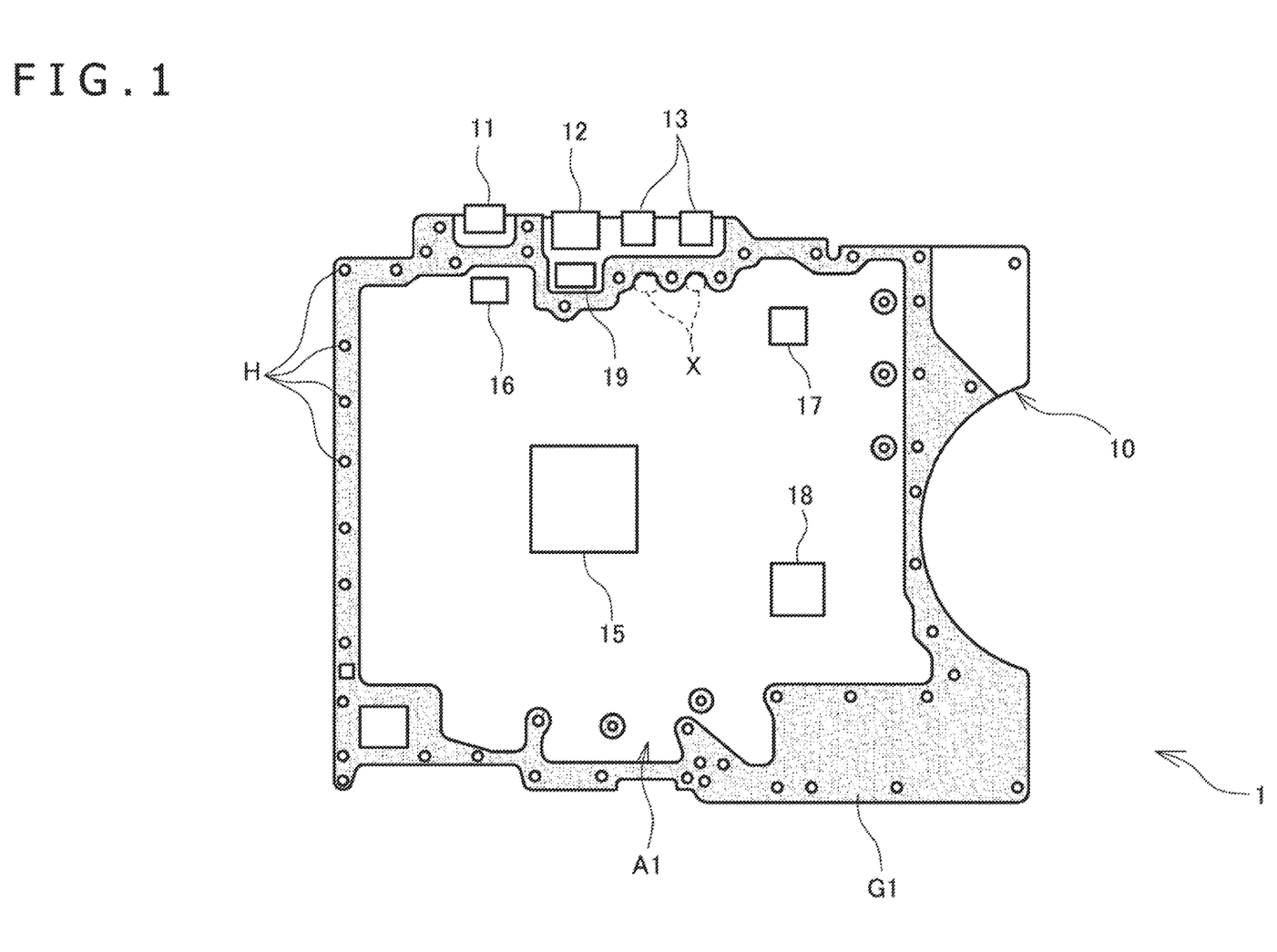
FIG. 1 is a plan view of a printed board incorporated in an electronic apparatus according to an embodiment of the present disclosure.
Figure 2:
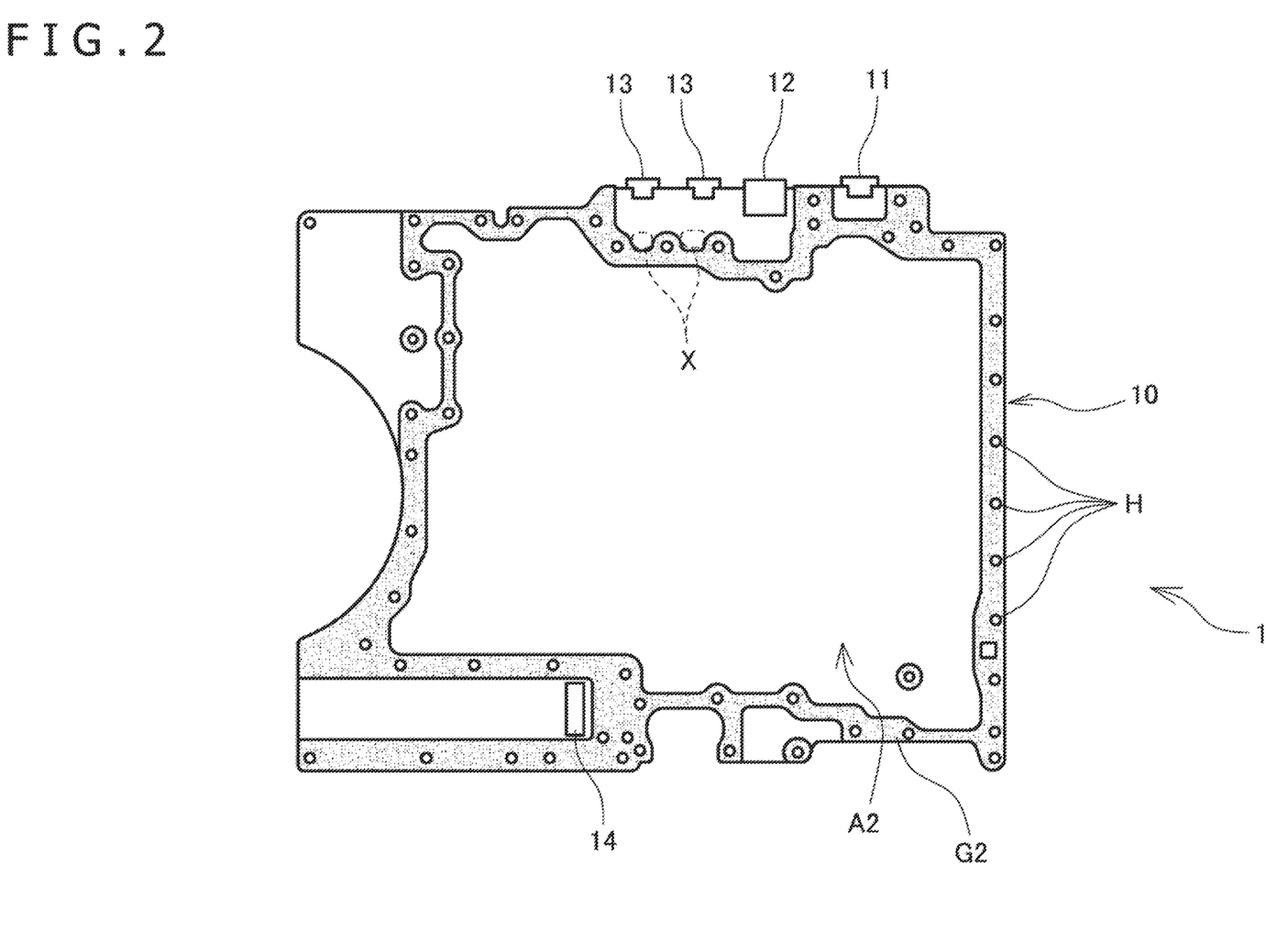
FIG. 2 is a bottom view of the printed board incorporated in the electronic apparatus according to the embodiment of the present disclosure.

An electronic apparatus 1 is, for example, a home game console or the like, and includes a printed board (printed wiring board) 10, an upper-side shield member 30, and a lower-side shield member 40. FIG. 1 is a schematic plan view depicting a manner on a front surface side of the printed board 10 incorporated in the electronic apparatus 1 according to an embodiment of the present disclosure. In addition, FIG. 2 is a bottom view depicting a manner on a back surface side of the printed board 10.

As illustrated in FIG. 1, various kinds of circuit elements are mounted on a front surface of the printed board 10. In addition, through omitted from illustration, various kinds of circuit elements are mounted also on a back surface of the printed board 10. Note that, in the present embodiment, the printed board 10 is a multilayer substrate that has a signal layer (inner layer) not only on the front surface and the back surface of the printed board 10, but also inside the printed board 10.

A plurality of connectors is disposed along the periphery of the printed board 10. These connectors are used for connection with devices incorporated in an external communication apparatus or in the electronic apparatus 1. Specifically, a video signal connector 11, a local area network (LAN) connector 12, and two universal serial bus (USB) connectors 13 are disposed on the front surface side of the printed board 10. Besides, a storage device connection connector 14 is disposed on the back surface side.

Integrated circuits (hereinafter referred to as communication control circuits) for controlling data communication through these connectors are disposed on the front surface of the printed board 10. Specifically, a system-on-a-chip (SoC) 15, a video signal control circuit 16, a LAN communication control circuit 17, and a storage device control circuit 18 are disposed as communication control circuits on the front surface of the printed board 10. In addition, a LAN pulse transformer 19 is also disposed on the front surface of the printed board 10. Note that various kinds of circuit elements other than these may be disposed on the front surface and the back surface of the printed board 10. Besides, in FIGS. 1 and 2, illustration of signal wires disposed on the front surface and the back surface of the printed board 10 is omitted.

The video signal connector 11 is used for transmitting video signals to an external video display apparatus. The video signal connector 11 may be a connector for transmitting video signals according, for example, to the High-Definition Multimedia Interface (HDMI) (registered trademark) standard. The video signal control circuit 16 is a communication control circuit for controlling data communication with an external video display apparatus through the video signal connector 11. Specifically, the video signal control circuit 16 generates a video signal according to a standard such as HDMI and outputs the video signal to the video signal connector 11.

The LAN connector 12 is used for connecting the electronic apparatus 1 to a LAN. The LAN connector 12 transmits and receives data according, for example, to the Ethernet (registered trademark) standard. The LAN communication control circuit 17 is a communication control circuit for controlling data communication through the LAN connector 12. Specifically, the LAN communication control circuit 17 performs encoding of data to be transmitted through the LAN connector 12 and decoding of a signal received through the LAN connector 12. The LAN pulse transformer 19 is a passive element which is disposed in a communication path between the LAN connector 12 and the LAN communication control circuit 17 and relays communication.

The two USB connectors 13 are each used for connecting a USB device apparatus. The SoC 15 is an integrated circuit for executing various kinds of information processing for controlling the operation of the entire electronic apparatus 1. In particular, in the present embodiment, the SoC 15 functions also as a communication control circuit for controlling serial communication through the USB connector 13. Specifically, the SoC 15 outputs a signal to be transmitted to a USB device apparatus through the USB connector 13 or processes a signal received from the USB device apparatus through the USB connector 13.

The storage device connection connector 14 is used for connection of a storage device (not illustrated) such as a solid state drive (SSD) incorporated in the electronic apparatus 1. The storage device control circuit 18 is a communication control circuit for controlling access to the storage device. The storage device control circuit 18 performs access control such as writing and reading of data with respect to the storage device through the storage device connection connector 14.

Ground patterns serving as a reference potential for the electronic circuits mounted on the printed board 10 are formed on the front surface and the back surface of the printed board 10. In FIGS. 1 and 2, the ground patterns are represented by shading. In the present embodiment, shield areas are defined by the respective ground patterns on the front surface and the back surface of the printed board 10. Specifically, a shield area A1 whose periphery is surrounded by a ground pattern G1 is formed on the front surface of the printed board 10. In addition, a shield area A2 whose periphery is surrounded by a ground pattern G2 is formed on the back surface of the printed board 10.

In the present embodiment, a counter measure against noise for control so as to prevent noises generated in the shield areas from being propagated to the outside of the shield areas is achieved for the respective shield areas on the front surface and the back surface. Such a counter measure against noise is achieved by the upper-side shield member 30 and the lower-side shield member 40. The upper-side shield member 30 and the lower-side shield member 40 are each produced by molding a conductive metal sheet and each have a recessed part. These shield members can each be produced by subjecting a single metal sheet to forming such as drawing.

Figure 3:
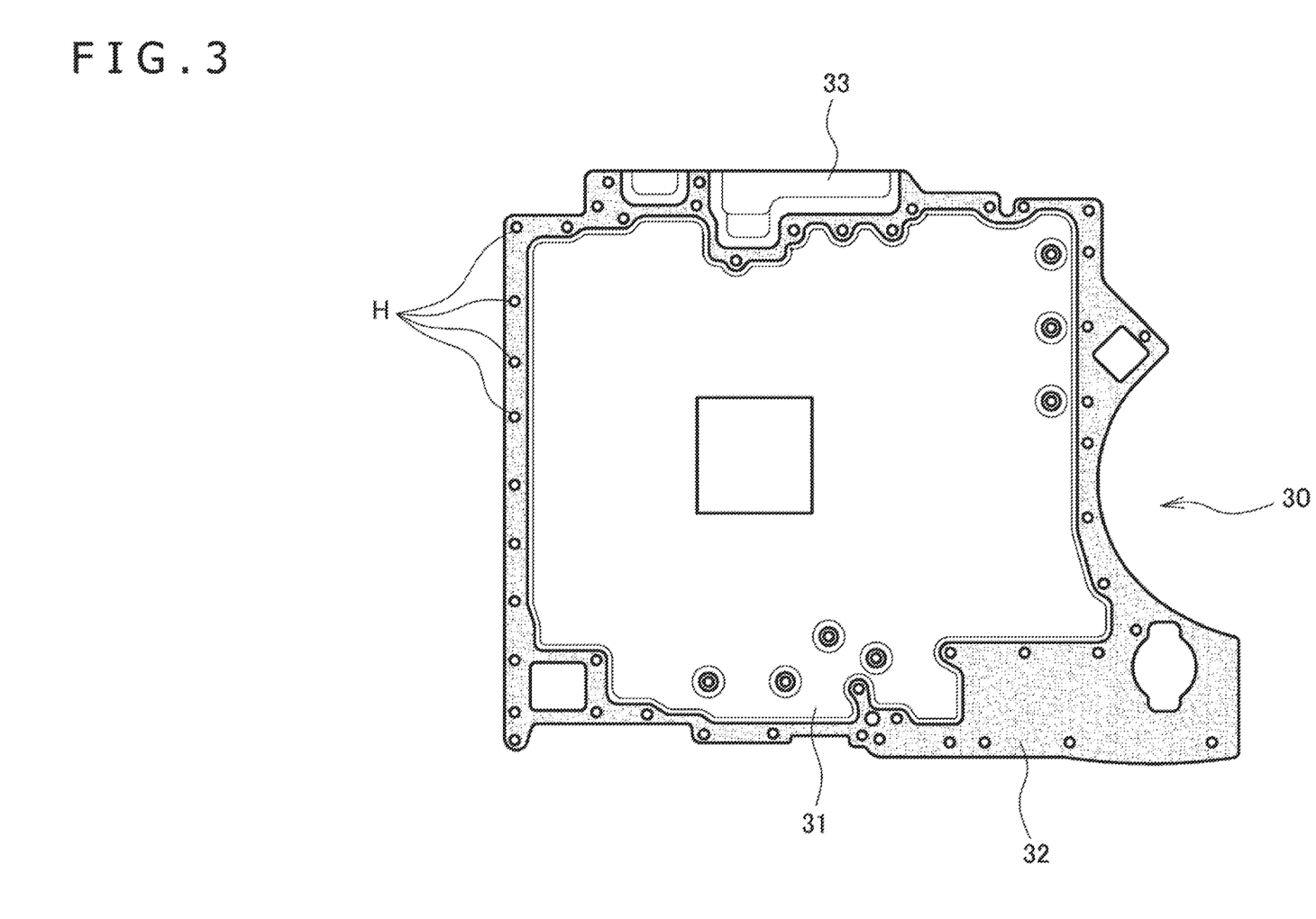
FIG. 3 is a plan view of an upper-side shield member.
Figure 4:
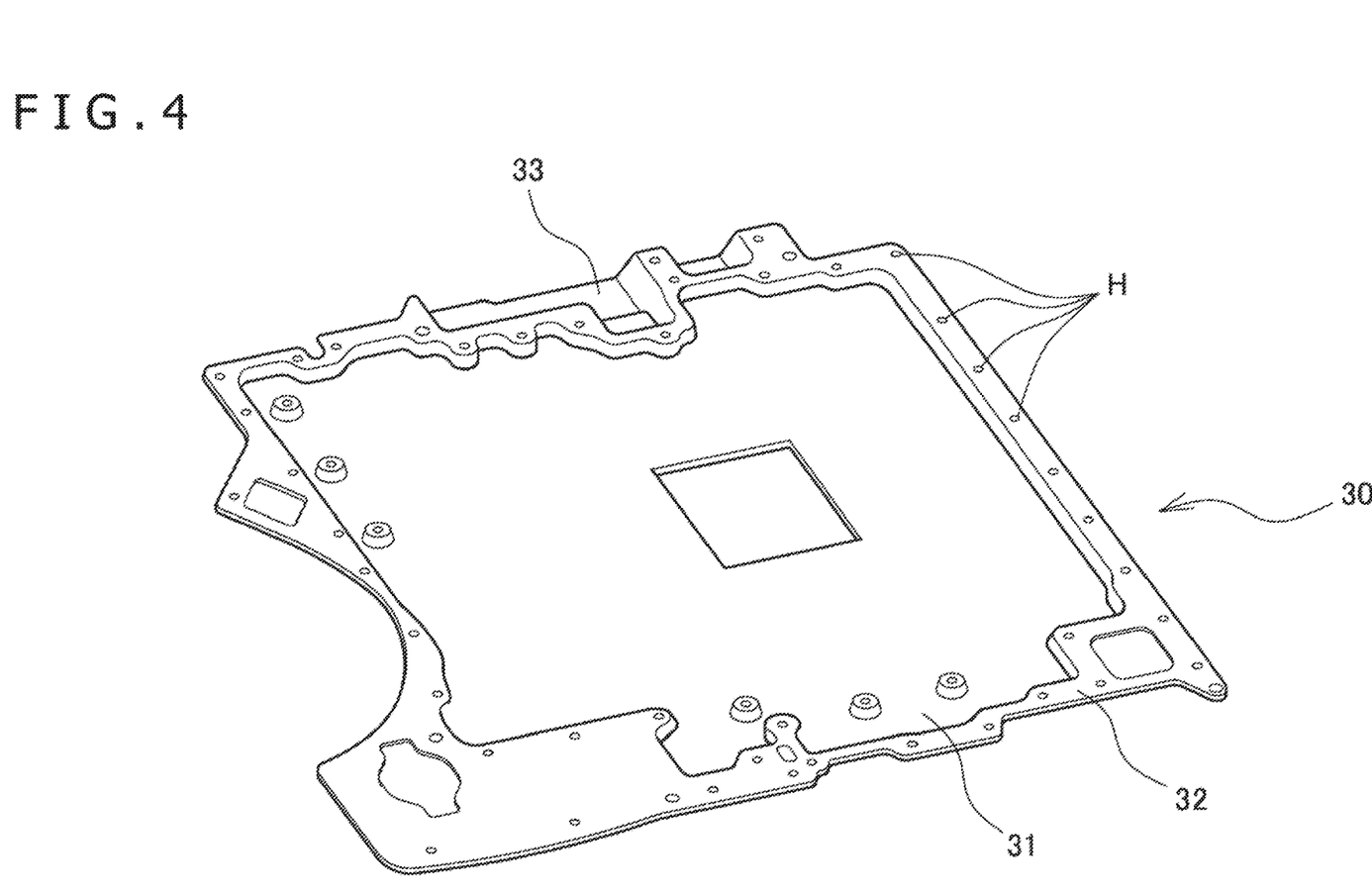
FIG. 4 is a perspective view of the upper-side shield member, as viewed from a bottom surface side of the upper-side shield member.

The upper-side shield member 30 is disposed to face the front surface of the printed board 10. FIG. 3 is a plan view depicting an upper surface (a surface opposite to a surface facing the front surface of the printed board 10) of the upper-side shield member 30, and FIG. 4 is a perspective view of the upper-side shield member 30 as viewed from the side of a bottom surface (a surface facing the front surface of the printed board 10). As depicted in these figures, the upper-side shield member 30 has a shield part 31 with a surface facing the printed board 10 formed in a recessed shape, in a central portion of the upper-side shield member 30. The upper-side shield member 30 is fixed to the printed board 10 such that the shield part 31 overlaps with the shield area A1 in plan view. Note that a rectangular opening in the vicinity of the center of the shield part 31 is closed with a heat sink attached to the SoC 15.

An annular part 32 flat on the back surface side is formed so as to surround the periphery of the shield part 31. In a state in which the upper-side shield member 30 is fixed to the printed board 10, the annular part 32 is electrically connected to the ground pattern G1. Note that, in FIG. 3, the annular part 32 is represented by shading.

As illustrated in FIG. 1, the various kinds of connectors (the video signal connector 11, the LAN connector 12, and the two USB connectors 13) mounted on the printed board 10 are each disposed outside the ground pattern G1 surrounding the shield area A1. Meanwhile, the communication control circuits which control communication through these connectors (the SoC 15, the video signal control circuit 16, the LAN communication control circuit 17, and the storage device control circuit 18) are each disposed inside the shield area A1. With the upper-side shield member 30 disposed such that the shield area A1 is covered with the shield part 31, such a shielding that noises radiated by the communication control circuits in the shield area A1 are not propagated to the outside can be realized. Note that, in the present embodiment, the LAN pulse transformer 19 which is a passive element is disposed outside the shield area A1.

Here, the connector disposed outside the shield area A1 and the communication control circuit which is disposed inside the shield area A1 and control the communication through the connector should be connected to each other by a signal line, as a matter of course. If the signal line simply includes a printed wire formed on the front surface of the printed board 10, the ground pattern G1 would be interrupted at the part where the printed wire passes. When the part where the ground pattern G1 is thus interrupted is present, noise may leak to the outside of the shield area through the part. In view of this, in the present embodiment, prevention of the ground pattern G1 from being interrupted by the signal line connecting the connector and the communication control circuit is realized by the configuration described later, and the ground pattern G1 is formed in an annular shape so as to surround, without interruption, the periphery of the shield area A1.

Further, the upper-side shield member 30 has a peripheral part 33 facing the area of the front surface of the printed board 10 which is outside the ground pattern G1. In the peripheral part 33, also, similarly to the shield part 31, a surface on the printed board 10 side is formed in a recessed shape. Some portions of the peripheral part 33 overlap with the video signal connector 11, the LAN connector 12, and the two USB connectors 13 in plan view and are electrically connected to housings of these connectors at the overlapping portions. Specifically, the peripheral part 33 is configured to come in contact with the housing of each connector through a conductive member such as a gasket or a metal spring. As a result, the upper-side shield member 30, as a single member, can shield the inside of the shield area A1 and can ground the housing of each connector.

Figure 5:
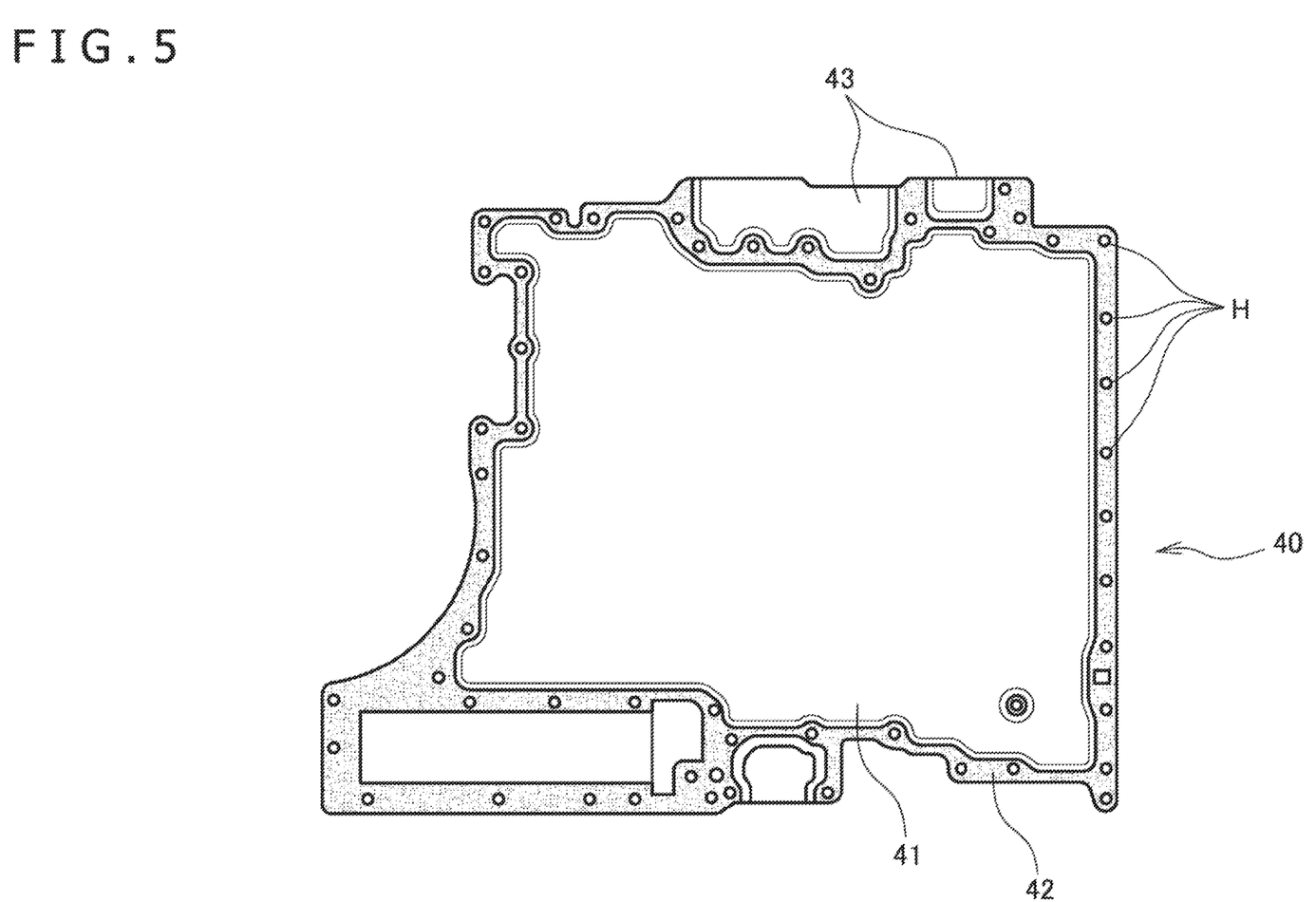
FIG. 5 is a bottom view of a lower-side shield member.
Figure 6:
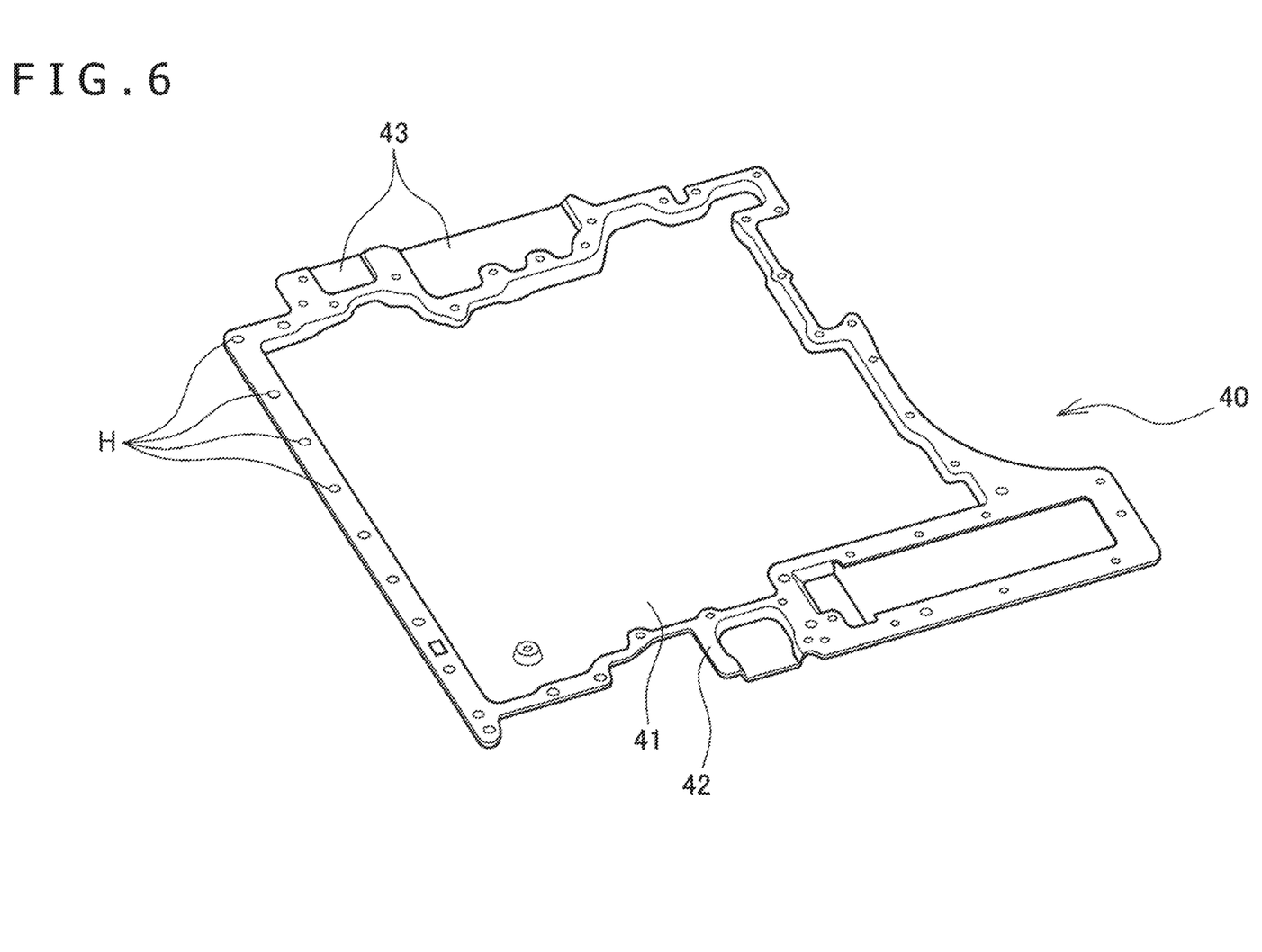
FIG. 6 is a perspective view of the lower-side shield member, as viewed from a top surface side of the lower-side shield member.

The lower-side shield member 40 is disposed to face the back surface of the printed board 10. FIG. 5 is a bottom view depicting a bottom surface (a surface opposite to a surface facing the back surface of the printed board 10) of the lower-side shield member 40, and FIG. 6 is a perspective view of the lower-side shield member 40 as viewed from the side of a top surface (the surface facing the back surface of the printed board 10).

Similarly to the upper-side shield member 30, the lower-side shield member 40 also includes a shield part 41 facing the shield area A2 of the back surface of the printed board 10, an annular part 42 facing the ground pattern G2 surrounding the shield area A2, and a peripheral part 43 facing the area outside the ground pattern G2. In addition, also on the back surface of the printed board 10, the ground pattern G2 is formed in an annular shape so as to surround, without interruption, the shield area A2. The annular part 42 of the lower-side shield member 40 is formed to be flat on the upper surface side and is electrically connected to the ground pattern G2. As a result, noise generated in the shield area A2 can be shielded by the lower-side shield member 40 and can be prevented from being propagated to the outside. Note that, in FIG. 5, the annular part 42 is represented by shading. Besides, similarly to the peripheral part 33 of the upper-side shield member 30, the peripheral part 43 may also be electrically connected to the housings of the video signal connector 11 and the USB connectors 13 through a gasket or the like disposed in a cutout portion of the printed board 10.

The annular part 32 of the upper-side shield member 30 and the annular part 42 of the lower-side shield member 40 are formed to overlap with each other in plan view, excepting some portions, and the portions are provided with tapped holes H at intervals. In addition, tapped holes H are formed also at positions in the ground patterns of the printed board 10 that overlap with these annular parts in plan view. By screwing the upper-side shield member 30, the printed board 10, and the lower-side shield member 40 through these tapped holes H, each shield member can be fixed to the printed board 10, and the annular part 32 and the annular part 42 can be electrically connected to the respective ground patterns G1 and G2.

Further, a plurality of projecting parts P projecting toward the facing shield members is disposed at the annular part 32 and the annular part 42. The projecting parts P are formed, for example, by adhering a conductive material such as solder to the ground patterns G1 and G2. With such projecting parts P provided at positions facing the annular part 32 or 42, tip ends of the projecting parts P come in contact with the annular part 32 or 42, whereby the shield members can be securely electrically connected to the ground pattern G1 or G2.

The tapped holes H and the projecting parts P are disposed to be adjacent to one another at intervals within a predetermined value, along the annular ground pattern extending along the periphery of the shield area. In other words, the tapped hole H and the projecting part P are disposed such that a distance to adjacent ones of the tapped holes H or the projecting parts P is within a predetermined value. This predetermined value is determined so as to be an electrical length of equal to or less than ¼ times a wavelength corresponding to a frequency of the noise radiated in the shield area. As a result, propagation of the noise to the outside of the shield area can be effectively restrained. In addition, the number of the projecting parts P disposed between adjacent ones of the tapped holes H is desirably one or two. As a result, it can be ensured that the projecting parts P are not aligned on both side of each projecting part P and that each projecting part P is adjacent to the tapped hole H on either one of both sides of the projecting part P. With this configuration, the projecting part P can also be securely brought into contact with the facing shield member by a fastening force at the time of screwing the tapped holes H.

Figure 7:
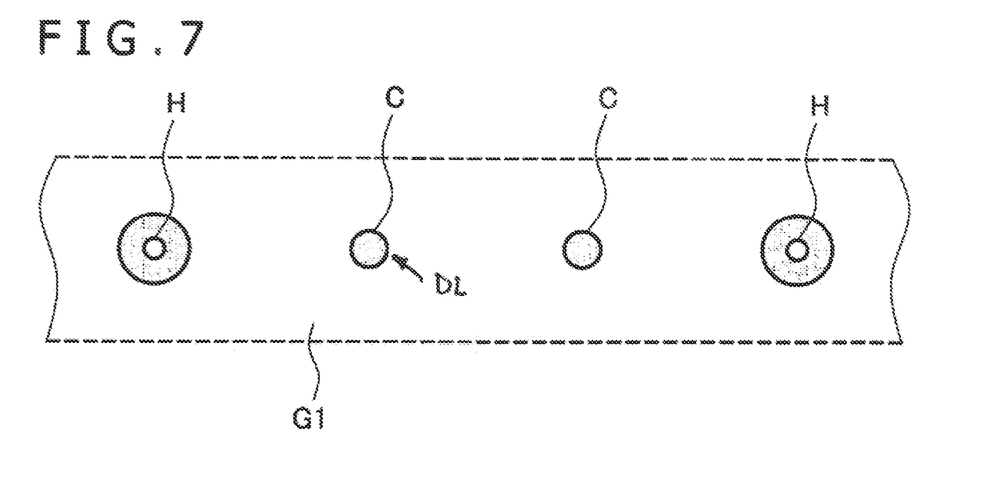
FIG. 7 is a partial enlarged view depicting an example of a ground pattern formed on a front surface of the printed board.

Besides, in the case of bringing the projecting parts P into contact with the shield member, it is unnecessary to expose all the ground pattern facing the annular part 32 or 42, and it is sufficient to expose, to the front surface, only the areas where the projecting parts P are formed and the areas surrounding the tapped holes H. FIG. 7 is a partial enlarged view depicting the manner of the front surface of the printed board 10 in this case. In this figure, an area where the ground pattern G1 is formed is indicated with a broken line. While the ground pattern G1 is formed in a belt shape, only the areas in the surroundings of the tapped holes H and two circular areas C where the projecting parts P are formed between adjacent ones of the tapped holes H are exposed to the front surface of the printed board 10. An area surrounding the circular areas C in which the projecting parts P are formed is left covered with a dielectric layer DL of the front surface of the printed board 10, and the conductive layer is not exposed there. By applying soldering to the circular areas C, the projecting parts P can be easily formed in the circular areas C by surface tension.

Note that the ground patterns G1 and G2 may be formed not only at the periphery of the shield area, but also in other areas, such as an area surrounding one of the connectors. For example, in FIG. 1, the ground pattern G1 is formed in a C shape in the surroundings of the video signal connector 11, whereby the video signal connector 11 is surrounded by the ground pattern G1 on three sides exclusive of the periphery of the printed board 10. The upper-side shield member 30 is formed in such a manner that the annular part 32 comes in contact also with the ground pattern G1 surrounding the video signal connector 11. Further, tapped holes H are disposed on both sides of the video signal connector 11 along the periphery of the printed board 10, and by screwing the upper-side shield member 30 through the tapped holes H, the upper-side shield member 30 is fixed such that the area overlapping with the video signal connector 11 in plan view is pressed against the video signal connector 11. As a result, it can be ensured that the peripheral part 33 of the upper-side shield member 30 is securely brought into contact with the housing of the video signal connector 11 and noises radiated from the video signal connector 11 and a video signal cable connected to the video signal connector 11 are not liable to affect the other connectors or the like.

Figure 8:
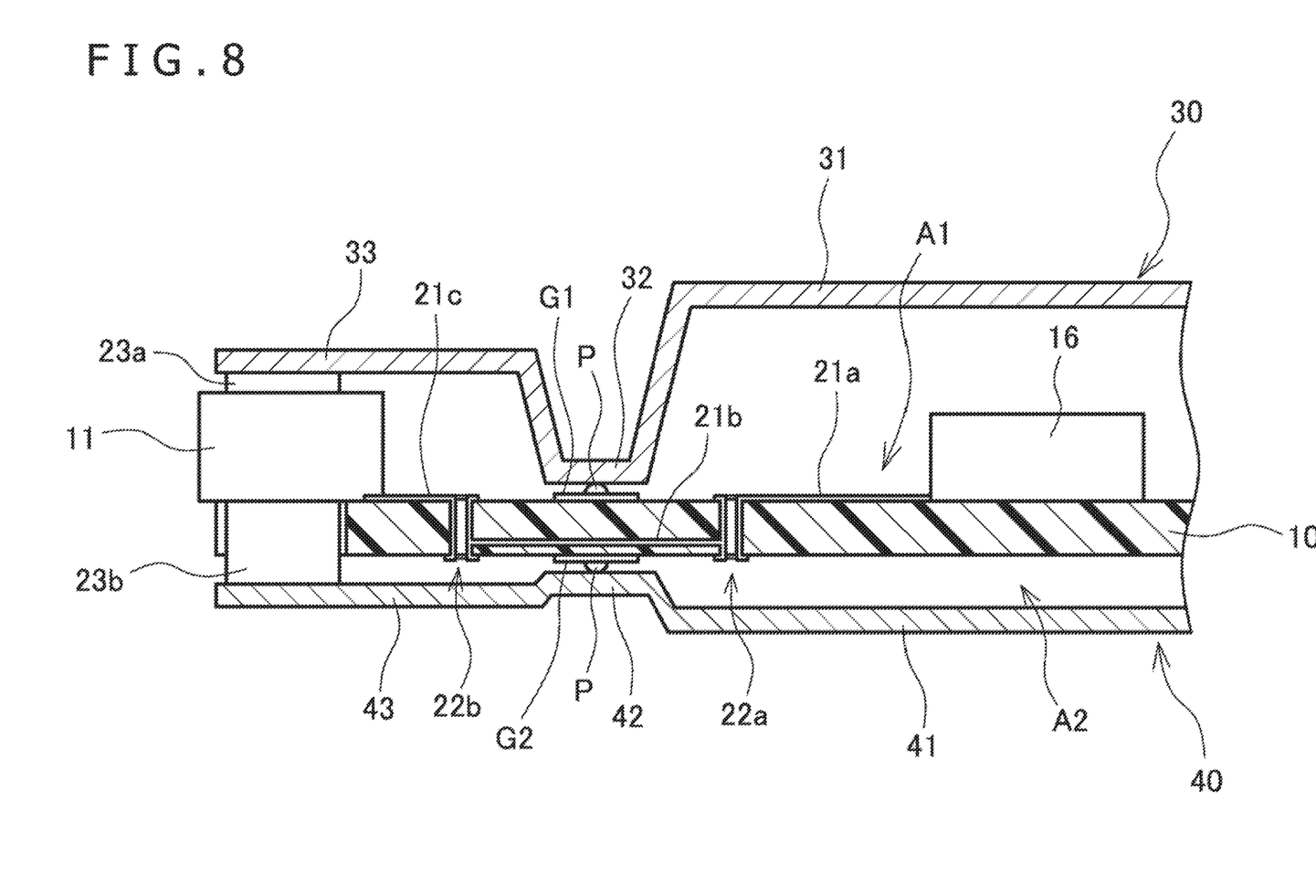
FIG. 8 is a sectional view depicting an example of connection mode between a connector and a communication control circuit.

A layout example of signal lines connecting the connectors and the corresponding communication control circuits will be described below. As an example, the connector and the communication control circuit may be connected through a signal line formed in an inner layer inside the printed board 10. FIG. 8 schematically depicts a layout example of the signal line in this case. In the example of this figure, a layout example of a signal line 21 connecting the video signal connector 11 and the video signal control circuit 16 is schematically illustrated.

The signal line 21 includes a signal line 21*a* disposed on the front surface of the printed board 10 in the shield area A1, a signal line 21*b* disposed in an inner layer of the printed board 10, and a signal line 21*c* disposed on the front surface of the printed board outside the shield area A1. The signal line 21*a* and the signal line 21*b* are connected through a via 22*a* in the shield area A1, whereas the signal line 21*b* and the signal line 21*c* are connected through a via 22*b* outside the shield area A1. The signal line 21*b* intersects the ground pattern G1 in plan view. With such a layout, the inside and the outside of the shield area A1 can be connected without interrupting the ground pattern G1.

Note that, in the example of this figure, the housing of the video signal connector 11 is connected to the upper-side shield member 30 through a gasket 23a. In addition, the housing is connected to the lower-side shield member 40 through a gasket 23b disposed in a cutout formed in the printed board 10. Also, in the example of this figure, each of the annular part 32 of the upper-side shield member 30 and the annular part 42 of the lower-side shield member 40 is connected to the facing ground pattern through the projecting parts P.

However, depending on the specification and the like required for the connectors or the communication control circuits, there may be cases where it is difficult to dispose the signal lines in the inner layer of the printed board 10. In such a case, by shifting each position of the ground pattern G1 on the front surface side of the printed board 10 and the ground pattern G2 on the back surface side, it can be ensured that the signal lines are disposed on the front surface and the back surface of the printed board 10 and that the ground pattern is prevented from being interrupted on the front surface or the back surface. In this example, an overlapping area X where an area inside the shield area A1 and an area outside the shield area A2 overlap with each other in plan view is secured. Then, the signal line on the front surface of the printed board 10 and the signal line on the back surface of the printed board 10 are connected through a via which is provided in the overlapping area X and penetrates the printed board 10. As a result, a signal line connecting from the inside of the shield area to the outside of the shield area can be disposed without interrupting the ground pattern G.

Figure 9:
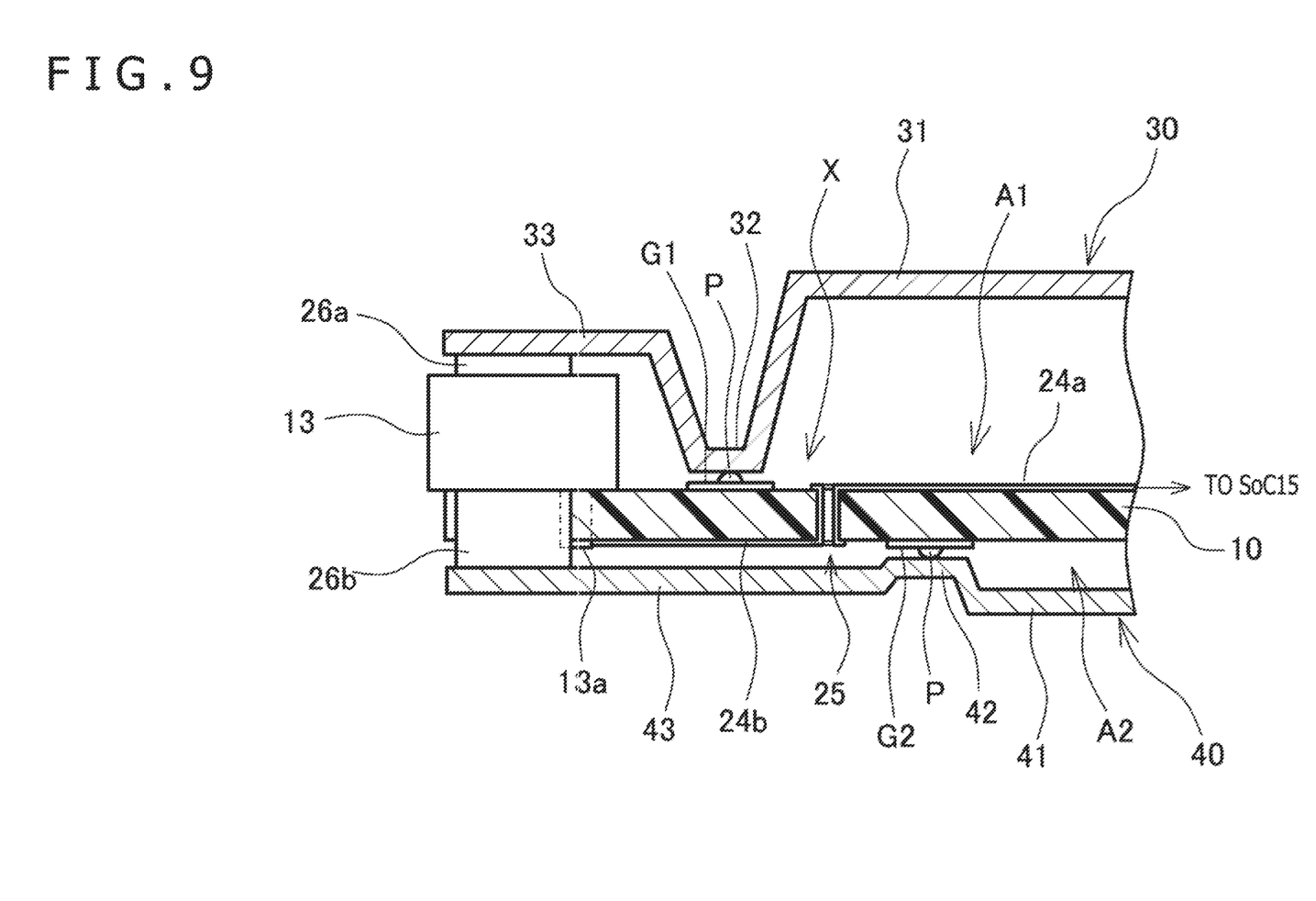
FIG. 9 is a sectional view depicting another example of the connection mode between the connector and the communication control circuit.

FIG. 9 depicts a layout example of a signal line in this example. In the example of this figure, the USB connector 13 and the SoC 15 are connected by a signal line 24. The signal line 24 includes a signal line 24a disposed in the shield area A1 on the front surface of the printed board 10, and a signal line 24b disposed outside the shield area A2 on the back surface of the printed board 10. The signal line 24a and the signal line 24b are connected through a via 25 provided in the overlapping area X. In other words, the signal line 24a intersects the ground pattern G2 on the back surface side in plan view, whereas the signal line 24b intersects the ground pattern G1 on the front surface side in plan view. A signal line 25b is connected to a terminal 13a of the USB connector 13 projecting to the back surface side of the printed board 10. With such a layout, the inside and the outside of the shield area can be connected, without disposing the signal line 24 in the inner layer of the printed board 10.

Note that, as illustrated in FIG. 9, the ground pattern G1 and the ground pattern G2 defining the overlapping area X are shifted from each other in plan view. Therefore, it is configured such that the ground patterns G1 and G2 are brought into contact with the corresponding shield members by the projecting parts P in the surroundings of the overlapping area X and the tapped holes H are provided in the vicinity of the overlapping area X at positions where the ground pattern G1 and the ground pattern G2 overlap with each other. In addition, in the example of this figure, the housing of the USB connector 13 is connected to the upper-side shield member 30 through a gasket 26a. Besides, the housing is connected to the lower-side shield member 40 through a gasket 26b disposed in a cutout formed in the printed board 10.

While an example in which the video signal connector 11 and the USB connectors 13 are connected to the corresponding communication control circuits has been described in the above description, the other connectors are also similarly connected to the corresponding communication control circuits without interrupting the ground pattern G1 or G2.

As has been described above, according to the electronic apparatus 1 according to the present embodiment, the shield area A1 is defined by the ground pattern G1 formed on the front surface of the printed board 10 without interruption, and the upper-side shield member 30 is fixed so as to cover the shield area A1 and come in contact with the ground pattern G1, whereby propagation of noises generated in the shield area A1 can be effectively restrained. In addition, similarly, also with respect to the back surface of the printed board 10, propagation of noises generated in the shield area A2 can be restrained by the lower-side shield member 40.

Note that the embodiment of the present disclosure is not limited to those described above. For example, the layout of the various kinds of connectors and communication control circuits on the printed board 10 is merely one example, and any layout may be adopted insofar as the communication control circuits are disposed inside the shield area and the connectors connected thereto are disposed outside the shield area. Besides, the kinds of the connectors and the communication control circuits disposed on the printed board 10 may also be different from the above-described ones. For example, the printed board 10 may be provided with connectors for connecting a storage device such as an optical disc drive according to such a standard as the serial advanced technology attachment (ATA) standard.

In addition, while the electronic apparatus 1 has been a home game console in the above description, the electronic apparatus 1 according to an embodiment of the present disclosure is not limited to this; for example, the electronic apparatus 1 may be any of various kinds of apparatuses including connectors and communication control circuits, such as, for example, a personal computer, a portable game machine, and a smart phone.

It should be understood by those skilled in the art that various modifications, combinations, sub-combinations and alterations may occur depending on design requirements and other factors insofar as they are within the scope of the appended claims or the equivalents thereof.

What is claimed is:
1. An electronic apparatus comprising:
   a printed board;
   a plurality of connectors mounted on the printed board;
   a plurality of communication control circuits that is mounted on the printed board and that controls communication through corresponding ones of the plurality of connectors; and
   a shield member disposed to face the printed board, wherein:
   an annular ground pattern surrounding, without interruption, a shield area including the plurality of communication control circuits is formed on a front surface of the printed board,
   the plurality of connectors is all disposed outside the ground pattern surrounding the shield area,
   the shield member covers the shield area and is fixed to the printed board such that a portion facing the ground pattern is electrically connected to the ground pattern,
   a plurality of tapped holes for screwing the shield member to the printed board and a plurality of projecting parts projecting toward the shield member side are disposed in the ground pattern, and
   the ground pattern has an area in which the projecting parts are formed exposed to the front surface of the printed board and has an area in a periphery of the area exposed covered with a dielectric layer.

2. The electronic apparatus according to claim 1, wherein the printed board is a multilayer substrate, and
one of the plurality of connectors is connected to the corresponding communication control circuit through a signal line disposed in an inner layer of the printed board.

3. The electronic apparatus according to claim 1, further comprising:
a first signal line disposed on the front surface of the printed board in the shield area; and
a second signal line disposed on a back surface of the printed board and connected to the first signal line through a via penetrating the printed board,
wherein one of the plurality of connectors is connected to the communication control circuit corresponding to the connector through the first and second signal lines.

4. The electronic apparatus according to claim 1, wherein the shield member is electrically connected to the ground pattern by coming in contact with screws passing through the tapped holes and the projecting parts.

\* \* \* \* \*